United States Patent

[11] 3,566,208

[72] Inventor Chan H. Wang
Saratoga, Calif.
[21] Appl. No. 702,634
[22] Filed Feb. 2, 1968
[45] Patented Feb. 23, 1971
[73] Assignee Fairchild Camera and Instrument Corporation
Syosset, Long Island, N.Y.

[54] PIN SOCKET
10 Claims, 2 Drawing Figs.

[52] U.S. Cl. .......... 317/234,
317/101, 317/235, 174/52, 174/68.5, 339/17, 339/18
[51] Int. Cl. .......... H01l 1/14
[50] Field of Search .......... 317/234, 235, 3, 4, 4.1, 5, 5.4; 174/52, (F.P.), 52.5, 52.6; 317/101; 339/17, 18, 18 (CP), (Inquired), 117, 227; 174/68.5, (Inquired)

[56] References Cited

UNITED STATES PATENTS 3,262,022 7/1966 Caracciolo .......... 317/101
3,283,224 11/1966 Erkan .......... 317/234

*Primary Examiner*—John W. Huckert
*Assistant Examiner*—R. F. Polissack
*Attorney*—Roger S. Borovoy

ABSTRACT: A semiconductor device assembly including an insulating substrate and a plurality of L-shaped pins disposed around the periphery of the substrate. The pins fit in slots on the top surface of the substrate and the semiconductor device is centrally located with respect to the pins adjacent the substrate. Electrical connections are made between portions of the device and the pins. The entire device, pins, and substrate are covered with an insulating coating.

INVENTOR.
CHAN HUAN WANG
BY
ATTORNEY

PIN SOCKET

FIELD OF THE INVENTION

The subject invention relates to a semiconductor device and package assembly having the same pin configuration as a vacuum tube.

DESCRIPTION OF THE PRIOR ART

VACUUM tube sockets, for example, miniature 7-pin and 9-pin sockets, are readily available. There is a need for a semiconductor device, such as a transistor or an integrated circuit, which will fit into a conventional vacuum tube socket. However, difficulties have arisen in obtaining such a semiconductor device enclosure. In a vacuum tube, the pins are easily sealed in the glass envelope of the tube. However, such a glass envelope is not available in conventional semiconductor device packages. Accordingly, it was necessary to devise a package wherein the pins can be sealed in an insulating material which is not a glass.

SUMMARY OF THE INVENTION

Briefly, the semiconductor device assembly of the invention comprises an insulating substrate having a plurality of holes circumferentially disposed about its periphery in a plurality of slots, one for each hole, one of the slots adjoining each hole and perpendicularly intersecting the hole, the upper surface of the slots lying in a plane; a plurality of pins having a substantially 90° bend between a first portion and a second portion, the first portion being adapted to fit into the hole and the second portion being adapted to lie in the slots, the top surface of the second portions extending above the plane of the upper surface of the slot; a semiconductor device mounted centrally on one surface of the substrate adjacent all of the slots; connecting means connecting the semiconductor device to the top surfaces of the second portions of at least some of the pins; and an insulating coating covering the semiconductor device, the connecting means, and the top surfaces of the second portions of the pins.

BRIEF DESCRIPTION OF THE DRAWINGS

The device assembly of the invention will be better understood from the more detailed description which follows, including the method for assembling the package, making reference to the drawings in which.

DESCRIPTION OF THE PREFERRED EMBODIMENT

Figure 1:
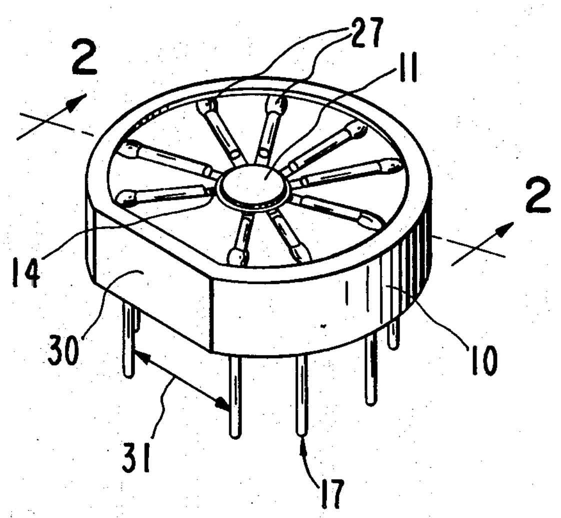
FIG. 1 is a perspective view of the package of the subject invention with the plastic covering removed in order to reveal the pins.
Figure 2:
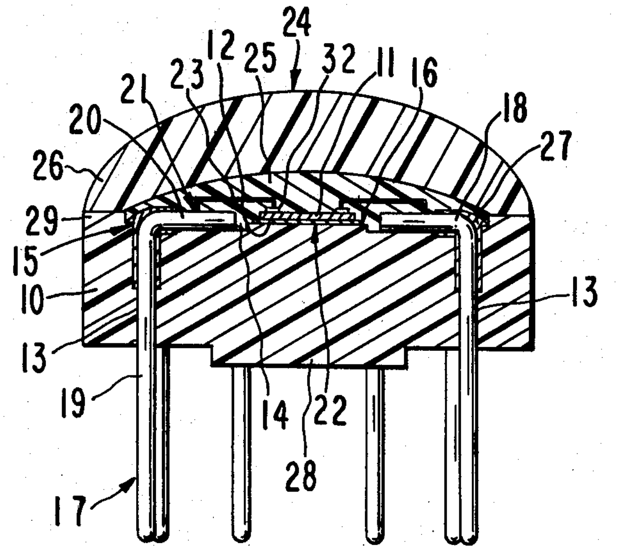
FIG. 2 is a cross section taken through the plane 2–2 of the package of FIG. 1 and adding the plastic covering.

Referring to FIGS. 1 and 2, substrate 10 is an insulating material capable of withstanding high temperatures, for example, in excess of 400° C. Ceramic materials are excellent for this purpose. Temperature resistance is particularly important where the semiconductor device 11 is to be attached to the substrate 10 by means of a bounding layer 12. If such a bonding layer 12 is gold, for example, bonding temperatures of about 410° C. are required to achieve a firm bond between the device 11 and the substrate 10.

Substrate 10 has a plurality of holes 13 disposed around its periphery. The substrate also has a plurality of slots 14, as shown in FIG. 1, one intersecting the hole 13 at intersection 15. The upper surface of each slot 14 lies in a plane 16.

A plurality of pins 17, preferably gold plated, are disposed, respectively, in each of the holes 13. These pins have a substantially 90° bend 18 between a first portion 19 and a second portion 20. The first portion 19 is adapted to fit into holes 13; the second portion 20 is adapted to lie in slots 14. The top surface 21 of the second portion 20 of each pin extends above the plane 16 of the upper surface of the slots 14 to place them into a position where wires may be easily attached to their upper surfaces.

Semiconductor device 11 is centrally mounted on the surface of the central portion 22 of substrate 10. Note that device 11 is mounted adjacent the ends of each of slots 14. An intervening conventional gold bonding layer 12 is used to attach the semiconductor die to the ceramic central portion 22. This method provides good heat dissipation between the device 11 and the substrate 10.

Preferably the top surface of the semiconductor device 11 lies in a plane below the top surfaces 21 of pins 17. Then the wire interconnections between the device and the pins will extend in an upward direction from the bonding pads 32 on device 11 to the top surfaces 21 of pins 17. The wires then will be spaced apart from the upper surface of device 11. In that manner, short circuits between these wires and other portions of the upper surface of device 11 to which they are not to be connected are prevented.

A plurality of connecting means or wires 23 are used to connect regions of the semiconductor device 11 to the top surfaces 21 of the second portions 20 of pins 17. In a preferred embodiment of the invention, these top surfaces 21 are flattened to make it easier to connect wires 23.

The entire assembly of the invention, including the second portions 20 of pins 17, the connections 23 to device 11, and the device 11 itself is covered with an insulating material 24. Preferably, this material is an epoxy compound. In a preferred embodiment of the invention, the epoxy may have two layers 25 and 26. First layer 25 is a thin layer just sufficiently thick to cover the components, as shown. The second layer 26 is a thicker layer used to provide structural support and to ensure complete protection of the device in the enclosure from its environment. Both of these layers are preferably epoxy materials, but generally are of different composition. These materials are well known in the art. First layer 25, for example, can be a silicone rubber compound, for example Dow Junction Coating. Second layer 26 is a conventional epoxy formulation such as Hysol 586-778 epoxy.

In a preferred embodiment of the invention, pins 17 are sealed in holes 13 by means of a sealing glass 27, such as a low temperature solder glass well known in the art. Sealing the pins makes a completely rugged structure and prevents the pins and the connecting means 23 from coming loose during normal plugging and unplugging of the device from the socket.

A preferred embodiment of the invention uses a spacer 28 on the lower side of the substrate opposite the semiconductor device. This spacer 28 makes it easier to plug and unplug the device and also allows air to circulate between the socket (not shown) and the substrate. Such an air gap provides better heat dissipation. The preferred embodiment of the invention also employs a peripheral edge 29 of substrate 10 raised above the plane of the upper surface 16 of slots 14. This raised edge makes the application of the insulating layers 25 and 26 considerably easier. Finally, a preferred embodiment of the invention employs a substantially circular substrate 10 except for one flat edge 30 (FIG. 1). This flat edge serves as an alignment marker to indicate where the conventional wider spacing 31 between one pair of pins 17 occurs.

The assembly of the package of the invention is as follows: A conventional substrate, for example a ceramic, is formed such as by compressing a powder into the shape shown in FIGS. 1 and 2, having all the holes and indentations preformed. A layer 12, e.g. gold paste, is painted, sprayed, or otherwise applied to raised portion 22 of the substrate. In the case of gold, the substrate and the applied gold layer are baked in air at 900° C.—950°C. After cooling, the pins 17 are inserted into all of the holes. If desired, this can be done with an automated pin inserting machine. Next, the sealing glass 27 is applied in liquid form to the holes surrounding the corners of the pin. Normally this application is done from the top surface, but surrounds the pins along holes 13, as shown in FIG. 2. The entire substrate and pin assembly are then again baked in air at a temperature of about 500° C., or other temperature appropriate to the solder glass used, for about 5—10 minutes. This step seals the pins, the ceramic, and the solder glass.

Alternatively, the pins can be secured by mechanical means such as a nonuniformly constructed first portion 19 of pins 13. If instead of being cylindrical, portion 19 has an undulating shape, a friction grip will hold the pin together within holes 13.

Next, the semiconductor device 11 is attached to the gold layer 12 using die attach techniques conventional in the semiconductor art. Then the interconnecting wires 23 are bonded both to the semiconductor device surface on gold pads 32 and to the flat top surfaces 21 of the second portions 20 of pins 17. The bonding can be accomplished manually or automatically according to techniques well established in the semiconductor art.

Finally, liquid epoxy compounds are applied, such as from a dropper, or by automatic epoxy applicators, to the top surface of the device. In the preferred embodiment, a thin coating 25 is first applied and subsequently the second thicker coating 26 is applied to complete the device. This epoxy is cured at conventional epoxy curing temperatures to complete the semiconductor device and package assembly.

Since many modifications can be made by one skilled in the art in the assembly method and construction details of the package assembly of the invention, the only limitations to be placed upon the scope of the invention are those specifically recited in the claims which follow:

I claim:

1. A semiconductor device assembly capable of being fabricated using high-volume, automated assembly techniques, the assembly comprising:
  - an insulating substrate having a plurality of holes therethrough disposed around its periphery and a plurality of slots, one for each hole, each hole perpendicularly intersecting a respective slot, the upper surface of said slots lying in a plane perpendicular to said holes;
  - a semiconductor device mounted centrally on the surface of said substrate in which said slots are provided;
  - a plurality of pins, each having a substantially 90° bend between a straight first portion fitting into a respective one of said holes and a straight second portion lying in the corresponding slot, the top surfaces of said second portions extending above said plane of the upper surfaces of said slots, said pins functioning both as output terminals for insertion into an electron tube socket and as interconnections between the output terminals and the centrally located semiconductor device;
  - connecting means electrically connecting said semiconductor device to the top surface of the second portions of at least some of said pins; and
  - an insulating coating covering said semiconductor device, said connecting means, and the top surfaces of said second portions of said pins.

2. The semiconductor device assembly of claim 1 further characterized by said insulating coating having two layers, a first layer of one insulating material and a second layer of another.

3. The semiconductor device assembly of claim 2 further characterized by said two layers each being a different type of epoxy compound.

4. The semiconductor device assembly of claim 1 further characterized by said pins being secured in the holes in said substrate by means of a sealing glass.

5. The semiconductor device assembly of claim 1 further characterized by said substrate having a centrally located raised area on the side thereof opposite the side upon which said semiconductor device is mounted.

6. The semiconductor device assembly of claim 1 further characterized by said semiconductor device being mounted upon said substrate by means of a metallic bonding layer.

7. The semiconductor device assembly of claim 1 further characterized by said semiconductor device being mounted on said substrate in approximately the same plane as the said plane of the upper surface of said slots.

8. The semiconductor device assembly of claim 1 further characterized by said substrate having a peripheral edge portion raised above the said plane of the upper surface of said slots.

9. The semiconductor device assembly of claim 1 further characterized by said second portions of said pins having a substantially flat upper surface to enable easy attachment of wires to said surface.

10. The semiconductor device assembly of claim 1 further characterized by said substrate being substantially circular, but having one flat edge along its circumference.